United States Patent [19]

Theunissen et al.

[11] Patent Number: 5,057,452
[45] Date of Patent: Oct. 15, 1991

[54] METHOD OF MANUFACTURING A SEMICONDUCTOR DEVICE

[75] Inventors: Matthias J. J. Theunissen; Johanna M. L. Mulder; Jan Haisma; Wilhelmus P. M. Rutten, all of Eindhoven, Netherlands

[73] Assignee: U.S. Philips Corporation, New York, N.Y.

[21] Appl. No.: 650,520

[22] Filed: Feb. 5, 1991

[30] Foreign Application Priority Data

Feb. 12, 1990 [NL] Netherlands ................ 9000324

[51] Int. Cl.5 .................. H01L 21/20; H01L 21/268
[52] U.S. Cl. ................................ 437/109; 437/173; 437/174; 437/89; 437/973; 148/DIG. 93; 148/DIG. 154
[58] Field of Search ............. 437/173, 174, 89, 109, 437/973; 148/DIG. 154, DIG. 48, DIG. 93, DIG. 150; 156/603

[56] References Cited

U.S. PATENT DOCUMENTS

| 4,358,326 | 11/1982 | Doo | 437/109 |
| 4,523,962 | 6/1985 | Nishimura | 148/DIG. 91 |
| 4,592,799 | 6/1986 | Hayafujii | 437/173 |
| 4,714,684 | 12/1987 | Sugahara et al. | 437/173 |
| 4,915,772 | 4/1990 | Fehlner et al. | 156/603 |

FOREIGN PATENT DOCUMENTS

| 26094 | 2/1983 | Japan | 437/89 |
| 251113 | 11/1986 | Japan | 437/973 |

Primary Examiner—Brian E. Hearn
Assistant Examiner—Linda J. Fleck
Attorney, Agent, or Firm—Paul R. Miller

[57] ABSTRACT

The invention relates to a method of manufacturing a semiconductor device in which a polycrystalline or amorphous silicon oxide layer 3, which is provided on a silicon oxide layer 2 on a monocrystalline silicon substrate 1 and which is in contact with the silicon substrate 1 via an opening 4 in the silicon layer 2, is recrystallized by means of a heat treatment in the presence of means for concentrating the heat at the opening 4. In a simple and inexpensive manner, these means consist of a second silicon oxide layer 5 and a second polycrystalline silicon layer 6, the second silicon oxide layer 5 having a thickness at the openings 4 which is smaller than that of the rest of the layer 5.

9 Claims, 1 Drawing Sheet

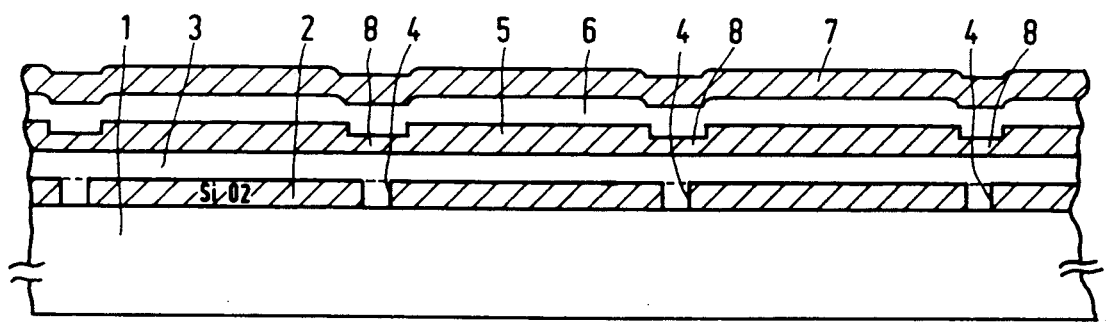

METHOD OF MANUFACTURING A SEMICONDUCTOR DEVICE

The invention relates to a method of manufacturing a semiconductor device in which a polycrystalline or amorphous silicon layer which is provided on a silicon oxide layer on a monocrystalline silicon substrate and which is in contact with the silicon substrate via an opening in the silicon oxide layer, is converted to a monocrystalline layer at least at the opening by means of a heat treatment in the presence of means for concentrating the heat at the opening.

A method of the kind described in the opening paragraph is known from the U.S. Pat. No. 4,592,799.

The recrystallization of a polycrystalline or amorphous silicon layer on a silicon oxide layer, by which a substantially monocrystalline silicon layer is formed, is a method known in the present state of the art.

The method often leads to substrate damage because of the high induced substrate temperature and the thermal gradients. This leads to degradation of characteristics of semiconductor devices and circuits present in the substrate.

Another problem in recrystallization is the occurrence of silicon mass transport under a covering silicon oxide layer which is often present on the polycrystalline or amorphous layer, so that monocrystalline silicon layers are formed with a non-uniform thickness.

A third problem is the following. In the method according to the cited U.S. Patent, the means for concentrating the heat consist of metal silicides, which are complex, time-consuming to provide, costly, and contaminating, especially at high temperatures.

The invention has for its object inter alia to obviate the said problems at least to a substantial degree.

According to the invention, therefore, the method described in the opening paragraph is characterized in that, before the heat treatment, the polycrystalline or amorphous silicon layer is provided with the said means in the form of a second silicon oxide layer, a second polycrystalline or amorphous silicon layer, and a covering layer, and in that the second silicon oxide layer is given a thickness at the openings in the first silicon oxide layer which is smaller than that of the rest of the second silicon oxide layer, and in that the converted first silicon layer is provided with circuit elements after the heat treatment.

The invention is based inter alia on the recognition that the said problems can be avoided by means of additional layers of the kind mentioned.

Among the findings was that, when two polycrystalline or amorphous silicon layers on top of one another are recrystallized simultaneously, the lower (first) layer remains very flat and yields large crystals. Owing to the thinner oxide above the opening, a greater heat flow arises in situ, which can compensate for the heat loss caused by the presence of the openings in the first silicon oxide layer. Substrate damage is absent. Alternatively, the means of concentrating the heat in the method according to the invention may be formed by means of standard technological methods.

The formation of silicon drops in the heat treatment is avoided by the covering layer. The covering layer consists of, for example, silicon oxide.

Preferably, the openings are given the shape of long, narrow grooves, which may possibly be interrupted in longitudinal direction.

The [100] or [100] direction is preferably chosen for the direction of the groove.

The heat treatment is carried out preferably by means of a laser. A comparatively thick covering layer can be used in this case. A continuous-wave carbon dioxide laser can be used to obtain particularly good results. A melting spot created is displaced in the groove direction in this method.

Sub-micron MOST devices can be made with comparatively thin first polycrystalline or amorphous silicon layers, with comparatively thick, mainly high-voltage and power semiconductor devices.

The invention will now be explained in more detail with reference to an embodiment and the accompanying drawing.

The FIGURE represents diagrammatically and in cross-section a portion of a semiconductor device in a stage of manufacturing by the method according to the invention.

The embodiment relates to a method of manufacturing a semiconductor device in which a polycrystalline or amorphous silicon oxide layer 3 is provided on a silicon oxide layer 2 on a monocrystalline silicon substrate 1 and is in contact with the silicon substrate 1 via one or several openings 4 in the silicon oxide layer 2. The layer 3 is converted to a monocrystalline layer by means of a heat treatment at least at the opening(s) 4 in the presence of means for concentrating the heat at the opening(s) 4.

According to the invention, these means consist of a second silicon oxide layer 5, a second polycrystalline or amorphous silicon layer 6, and a covering layer 7, the second silicon oxide layer 5 being given a thickness at the opening(s) 4 which is smaller than that of the rest of the second silicon oxide layer 5. After the heat treatment the converted first silicon layer 3 is provided with circuit elements (not shown). The substrate 1 and the layer 2, 3, 5, 6 and 7 and the opening(s) 4 are provided in a usual manner.

Thus, an n-type monocrystalline silicon substrate is used for the substrate 1. Layer 2 is a 1.2 $\mu$m thick silicon oxide layer having 1 $\mu$m wide opening 4. At the openings 4, by means of selective epitaxy, which is known per se, the openings 4 are filled with monocrystalline silicon up to the thickness of layer 2. Layer 3 is a 0.5 $\mu$m thick polycrystalline or amorphous silicon layer. Layer 5 is a 1.0 $\mu$m thick silicon oxide layer with depressions of 2 $\mu$m wide and 0.5 $\mu$m thick over the openings 4. Layer 6 is a 0.5 $\mu$m thick polycrystalline or amorphous silicon layer, and layer 7 is a 1.0 $\mu$m thick silicon oxide layer.

Long, narrow, possibly interrupted grooves are formed by means of the openings 4.

The direction of the grooves is preferably the [100] or [110] direction.

The first polycrystalline or amorphous silicon layer 3 is recrystallized epitaxially from the openings 4 by a heat treatment with a laser, for example a continuous-wave carbon dioxide laser. The carbon dioxide laser spot has a gaussian shape with an average cross-section equalling 8 $\mu$m or an elliptical shape with a major cross-section of, for example, 20 $\mu$m. A melt spot created by the laser treatment is displaced in the direction of the groove.

The invention is obviously not limited to the example given.

The thickness of the layer to be recrystallized may alternatively be, for example, 0.1-0.2 $\mu$m.

Instead of a carbon dioxide laser, an argon laser may also be used, or a heat treatment with an electron beam; layer 7 must be thinner if an argon laser or an electron beam is used. Obviously, shapes other than oblong shapes are also possible for the opening 4. A third silicon oxide layer and a third polycrystalline or amorphous silicon layer may also be used, in which case it is possible to recrystallize two layers at the same time.

It will be clear that many variations are possible for those skilled in the art within the scope of the invention.

We claim:

1. A method of manufacturing a semiconductor device in which a polycrystalline or amorphous silicon layer which is provided on a silicon oxide layer on a monocrystalline silicon substrate and which is in contact with the silicon substrate via an opening in the silicon oxide layer, is converted to a monocrystalline layer at least at the opening by means of a heat treatment in the presence of means for concentrating the heat at the opening, characterized in that, before the heat treatment, the polycrystalline or amorphous silicon layer is provided with the said means in the form of a second silicon oxide layer, a second polycrystalline or amorphous silicon layer, and a covering layer, and in that the second silicon oxide layer is given a thickness at the openings in the first silicon oxide layer which is smaller than that of the rest of the second silicon oxide layer, and in that the converted first silicon layer is provided with circuit elements after the heat treatment.

2. A method as claimed in claim 1, characterized in that the openings are given the shape of long, narrow grooves.

3. A method as claimed in claim 2, characterized in that the openings are interrupted in longitudinal direction.

4. A method as claimed in claim 2, characterized in that the [100] or [110] direction is chosen as the direction of the groove.

5. A method as claimed in claim 4, characterized in that the heat treatment is carried out by means of a laser, a melting spot being displaced in the direction of the grooves.

6. A method as claimed in claim 5, characterized in that a continuous-wave carbon dioxide laser is used.

7. A method as claimed in claim 2, characterized in that the [100] or [110] direction is chosen as the direction of the groove.

8. A method as claimed in claim 2, characterized in that the heat treatment is carried out by means of a laser, a melting spot being displaced in the direction of the grooves.

9. A method as claimed in claim 8, characterized in that a continuous-wave carbon dioxide laser is used.

* * * * *